(12) United States Patent
Kim et al.

(10) Patent No.: US 10,373,559 B2
(45) Date of Patent: Aug. 6, 2019

(54) ORGANIC LIGHT-EMITTING DEVICE AND ORGANIC LIGHT-EMITTING DISPLAY DEVICE USING THE SAME

(71) Applicant: LG DISPLAY CO., LTD., Seoul (KR)

(72) Inventors: Seok-Hyun Kim, Goyang-si (KR); Eun-Jung Park, Goyang-si (KR); Ho-Sung Kim, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/838,887

(22) Filed: Dec. 12, 2017

(65) Prior Publication Data

US 2018/0190193 A1 Jul. 5, 2018

(30) Foreign Application Priority Data

Dec. 30, 2016 (KR) .................. 10-2016-0184402

(51) Int. Cl.
| | |
|---|---|
| *H01L 29/08* | (2006.01) |
| *G09G 3/3233* | (2016.01) |
| *G09G 3/3291* | (2016.01) |
| *H01L 51/52* | (2006.01) |
| *G09G 3/3216* | (2016.01) |
| *H01L 27/32* | (2006.01) |
| *G09G 3/3225* | (2016.01) |

(52) U.S. Cl.
CPC ......... *G09G 3/3233* (2013.01); *G09G 3/3216* (2013.01); *G09G 3/3225* (2013.01); *G09G 3/3291* (2013.01); *H01L 27/3265* (2013.01); *H01L 27/3281* (2013.01); *H01L 51/5278* (2013.01); *H01L 51/5284* (2013.01); *H01L 51/5218* (2013.01); *H01L 51/5265* (2013.01)

(58) Field of Classification Search
CPC .................................................. G09G 3/3233
USPC ........................................................... 257/40
See application file for complete search history.

(56) References Cited

U.S. PATENT DOCUMENTS

| | | | | |
|---|---|---|---|---|
| 2007/0205716 | A1* | 9/2007 | Chen ...................... | B82Y 20/00 313/506 |
| 2008/0142794 | A1* | 6/2008 | Shitagaki ............ | H01L 51/5048 257/40 |
| 2012/0286320 | A1* | 11/2012 | Yamazaki ........... | H01L 27/3246 257/99 |
| 2014/0054570 | A1* | 2/2014 | Yang ................... | H01L 51/5004 257/40 |
| 2017/0338436 | A1* | 11/2017 | Mitsumori ............ | H01L 27/322 |

FOREIGN PATENT DOCUMENTS

| | | |
|---|---|---|
| CN | 101816080 A | 8/2010 |
| CN | 103681760 A | 3/2014 |
| CN | 104425761 A | 3/2015 |
| CN | 104752625 A | 7/2015 |
| CN | 106024844 A | 10/2016 |

\* cited by examiner

*Primary Examiner* — Ajay Arora
(74) *Attorney, Agent, or Firm* — Birch, Stewart, Kolasch & Birch, LLP

(57) ABSTRACT

An organic light-emitting device and an organic light-emitting display device using the same are discussed. In a structure in which emission layers that emit light having the same color are provided in a plurality of stacks, the emission layers have different properties such that the light emission efficiencies of the stacks are made uniform, whereby the lifespan of the organic light-emitting device is increased through charge balance.

13 Claims, 7 Drawing Sheets

EML2 (142): PH2+NH2+d
(PH2>PH1)

EML1 (122): PH1+NH1+d

EML2 (142): PH2+NH2+d

EML1 (122): PH1+NH1+d

HM1 of PH1 < HM2 of PH2
EM1 of NH1 > EM2 of NH2

ORGANIC LIGHT-EMITTING DEVICE AND ORGANIC LIGHT-EMITTING DISPLAY DEVICE USING THE SAME

CROSS-REFERENCE TO RELATED APPLICATION

This application claims the priority benefit of Korean Patent Application No. 10-2016-0184402, filed on Dec. 30, 2016 in the Republic of Korea, the disclosure of which is incorporated herein by reference into the present application.

BACKGROUND OF THE INVENTION

Field of the Invention

The present invention relates to an organic light-emitting device, and more particularly, to an organic light-emitting device configured such that, particularly in a double-stack structure, emission layers of stacks have different characteristics in order to prevent an emission zone from being changed over time, whereby the lifespan of the organic light-emitting device is increased and the efficiency of the organic light-emitting device is improved, and an organic light-emitting display device using the same.

Discussion of the Related Art

Recently, with the advent of the information age, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered to have a competitive application because it does not require a separate light source and enables the realization of a compact device design and vivid color display.

Such an organic light-emitting display device includes self-luminous devices, such as organic light-emitting devices, provided in sub-pixels, and performs display via operation of the organic light-emitting devices on a per-sub-pixel basis. In addition, the organic light-emitting devices may be used as self-luminous devices in a lighting apparatus as well as the display device, and thus the development of organic light-emitting devices has recently been in the spotlight in the lighting industry. In addition, because the organic light-emitting devices require no separate light source unit, they are also advantageously used in a flexible display device or a transparent display device.

Meanwhile, an organic light-emitting device includes an organic emission layer between two electrodes. In addition, electrons and holes from the two electrodes are injected into the organic emission layer, and excitons are produced in the organic emission layer via combination of the electrons and holes. Then, when the produced excitons fall from the excited state to the ground state, light is generated from the organic light-emitting device.

Meanwhile, a stack structure including a plurality of organic emission layers provided between an anode and a cathode so as to be separated from each other on the basis of a charge generation layer has been proposed in addition to the above basic organic light-emitting device.

Generally, a stack structure is expected to express mixed colors of light and to improve light enhancement characteristics through the organic emission layers. However, light is energy having a wave motion. In the case in which the organic emission layers are provided, therefore, it is not simple to achieve both the expression of mixed colors of light and the improvement of light enhancement characteristics, and the specific design of the organic emission layers is important in the organic light-emitting device.

In the stack structure, each stack has a plurality of layers. When the organic light-emitting device is driven for a predetermined period of time, the mobility of holes and electrons supplied to each stack is changed. As a result, the emission zone formed in the emission layer located under the charge generation layer and the emission zone formed in the emission layer located above the charge generation layer may be changed over time. If such a change is extreme, electrons or excitons may accumulate at the interface between the emission layer and another layer adjacent thereto. In this case, the lifespan of the organic light-emitting device is greatly reduced, and the recombination rate of the excitons is reduced, whereby the efficiency of the organic light-emitting device is reduced.

SUMMARY OF THE INVENTION

Accordingly, the present invention is directed to an organic light-emitting device and an organic light-emitting display device using the same that substantially obviate one or more problems due to limitations and disadvantages of the related art.

An object of the present invention is to provide an organic light-emitting device configured such that, in a double-stack structure, emission layers of stacks have different characteristics in order to prevent an emission zone from being changed over time, whereby the lifespan of the organic light-emitting device is increased and the efficiency of the organic light-emitting device is improved, and an organic light-emitting display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An organic light-emitting device according to embodiment(s) of the present invention is configured such that, in a structure in which emission layers that emit light having the same color are provided in a plurality of stacks, the emission layers have different properties such that the light emission efficiencies of the stacks are made uniform, whereby the lifespan of the organic light-emitting device is increased through charge balancing.

To achieve these objects and other advantages and in accordance with the purpose of the invention, as embodied and broadly described herein, an organic light-emitting device includes a first electrode and a second electrode opposite each other, a charge generation layer provided between the first electrode and the second electrode, a first stack provided between the first electrode and the charge generation layer, the first stack including a first hole transport layer, a first emission layer, and a first electron transport layer, and a second stack provided between the charge generation layer and the second electrode, the second stack including a second hole transport layer, a second emission layer, which emits the same color as the first emission layer, and a second electron transport layer, wherein the hole transport rate of the second emission layer is higher than the hole transport rate of the first emission layer.

The first emission layer and the second emission layer may have a first bipolar host and a second bipolar host, respectively, and the hole mobility of the second host may be higher than the hole mobility of the first host, or the highest occupied molecular orbital (HOMO) energy level of the second host may be lower than the HOMO energy level of the first host.

The electron mobility of the second host may be higher than the electron mobility of the first host.

The first emission layer may have a first hole transport host and a first electron transport host, and the second emission layer may have a second hole transport host and a second electron transport host. The electron transport rate of the first emission layer may be higher than the electron transport rate of the second emission layer, and the hole transport rate of the second emission layer may be higher than the hole transport rate of the first emission layer.

The second hole transport host in the second emission layer may be larger than the first hole transport host in the first emission layer, and the first electron transport host in the first emission layer may be larger than the second electron transport host in the second emission layer.

The hole mobility of the first hole transport host may be at least 10 times higher than the hole mobility of the first electron transport host, and the electron mobility of the first electron transport host may be at least 10 times higher than the electron mobility of the first hole transport host.

The hole mobility of the second hole transport host may be at least 10 times higher than the hole mobility of the second electron transport host, and the electron mobility of the second electron transport host may be at least 10 times higher than the electron mobility of the second hole transport host.

The hole mobility of the second hole transport host may be higher than the hole mobility of the first hole transport host, and the electron mobility of the first electron transport host may be higher than the electron mobility of the second electron transport host.

In another aspect of the present invention, an organic light-emitting display device includes a substrate having a plurality of sub-pixels, a thin film transistor provided at at least one of the sub-pixels on the substrate, and the above-described organic light-emitting device, the organic light-emitting device being connected to the thin film transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
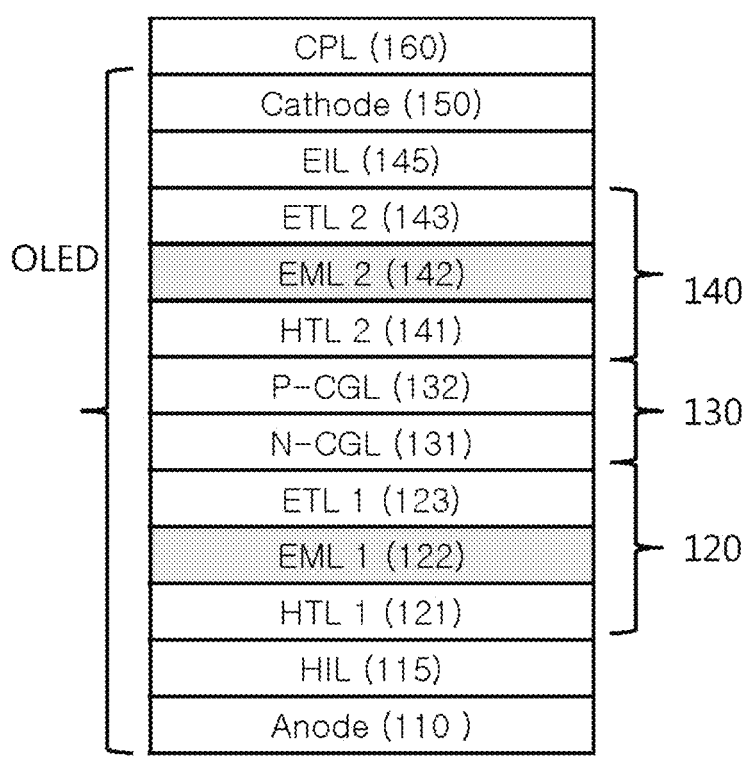
FIG. 1 is a sectional view showing an organic light-emitting device according to an embodiment of the present invention.

The advantages and features of the embodiments of the present invention and the way of attaining them will become apparent with reference to embodiments described below in detail in conjunction with the accompanying drawings. The present invention, however, is not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limitative of the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used therewith.

In the description of the various embodiments of the present invention, when describing temporal relationships, for example, when the temporal relationship between two actions is described using "after", "subsequently", "next", "before", or the like, the actions may not occur in succession unless the term "immediately" or "directly" is used therewith.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkages therebetween and operation methods thereof are possible. These various embodiments may be performed independently of each other, or may be performed in association with each other.

In this specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 10%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is included in an "undoped" layer. For example, when at least one of constituent materials of any layer is of a P-type and not all of the other constituent materials of the layer are of an N-type, the layer is included in the "undoped" layer. For example, when at least one of the constituent materials of any layer is an organic material and not all of the other constituent materials of the layer are an inorganic material, the layer is included in the "undoped" layer. For example, when all constituent materials of any layer are organic materials, at least one of the constituent materials is of an N-type, at least another constituent material is of a P-type, and the weight percent of the N-type material is less than 10% or the weight percent of the P-type material is less than 10%, the layer is included in the "doped" layer.

In this specification, a stack means a unit structure that includes organic layers such as a hole transport layer and an electron transport layer and an organic emission layer interposed between the hole transport layer and the electron transport layer. The organic layers may further include a hole injection layer, an electron blocking layer, a hole blocking layer, and an electron injection layer, and may further include other organic layers according to the structure or design of an organic light-emitting device.

FIG. 1 is a sectional view showing an organic light-emitting device according to an embodiment of the present invention. All the components of each of an organic light-emitting device and an organic light-emitting display device according to all embodiments of the present invention are operatively coupled and configured.

As shown in FIG. 1, the organic light-emitting device (OLED) according to the present invention includes a first electrode (anode) 110 and a second electrode (cathode) 150, which are opposite each other, a charge generation layer 130 provided between the first electrode 110 and the second electrode 150, a first stack 120 provided between the first electrode 110 and the charge generation layer 130, the first stack 120 including a first hole transport layer 121, a first emission layer 122, and a first electron transport layer 123, and a second stack 140 provided between the charge generation layer 130 and the second electrode 150, the second stack 140 including a second hole transport layer 141, a second emission layer 142, which emits the same color as the first emission layer 122, and a second electron transport layer 143.

The hole transport rate of the second emission layer 142, included in the second stack 140, is higher than that of the first emission layer 122. This is achieved by configuring a host constituting the second emission layer 142 so as to be different from a host constituting the first emission layer 122.

That is, the first and second emission layers 122 and 142 have different hosts, even though they emit the same color. Each of the first and second emission layers 122 and 142 includes a host, which is the main material thereof, and a dopant that receives energy from the host to contribute to light emission. The amount of dopant may be 10 wt % or less the total weight of each of the first and second emission layers 122 and 142.

Meanwhile, the charge generation layer 130 is configured to have a structure in which an n-type charge generation layer 131 and a p-type charge generation layer 132 are stacked. The charge generation layer 130 is located between the stacks 120 and 140, and supplies electrons and holes to the first electron transport layer 123 of the first stack and to the hole transport layer 141 of the second stack, which are adjacent thereto.

In addition to the stacks, a hole injection layer 115 and an electron injection layer 145, which abut the inner surfaces of the first and second electrodes 110 and 150, may be further included.

The reason that the first and second emission layers 122 and 142 of the first and second stacks 120 and 140 are different in construction from each other in the organic light-emitting device according to the present invention is as follows.

Figure 2A:
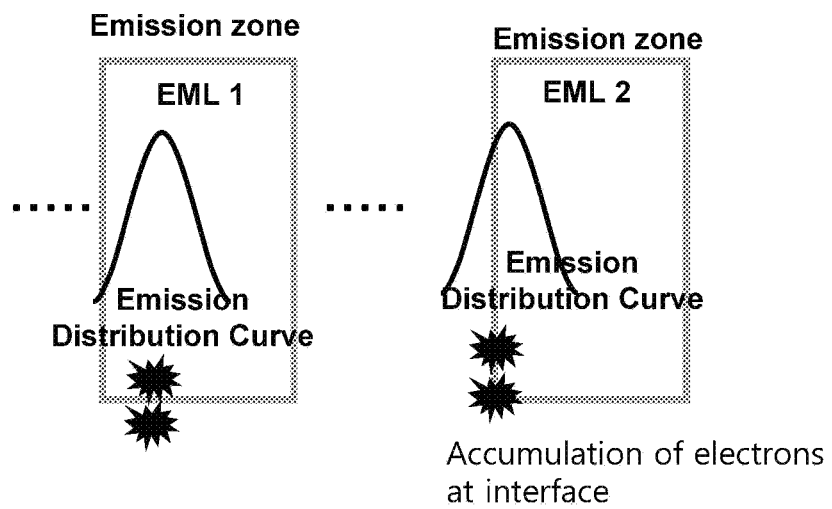
FIG. 2A is a view showing light emission distribution curves of an organic light-emitting device according to a comparative example.
Figure 2B:
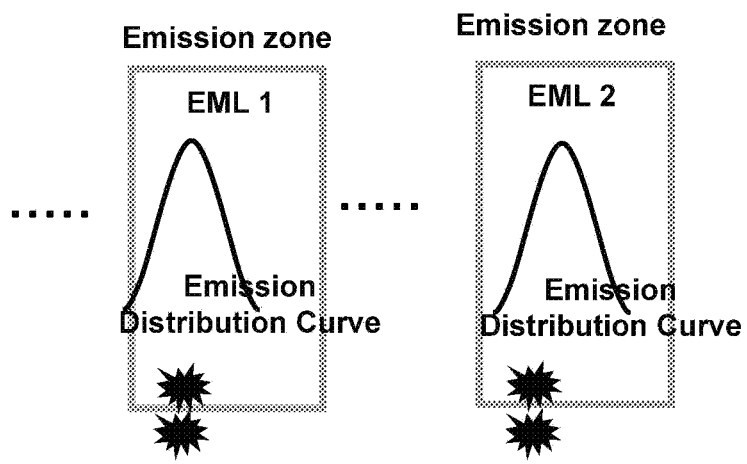
FIG. 2B is a view showing light emission distribution curves of the organic light-emitting device according to an embodiment of the present invention.

FIG. 2A is a view showing light emission distribution curves of an organic light-emitting device according to a comparative example, and FIG. 2B is a view showing light emission distribution curves of the organic light-emitting device according to the present invention.

A two-stack structure having the same color emission layers is provided to improve the color purity and efficiency of the emission layers.

Meanwhile, as for the average movement speed of general organic layers used between the first electrode and the second electrode of the organic light-emitting device, holes move about 100 times faster than electrons. The hole transport layer generally has the largest thickness in order to adjust the optical distance between the first and second electrodes, and the mobility of the organics between the first and second electrodes depends on the characteristics of the hole transport layer. Since the hole transportability of the hole transport layer is high, the hole transportability of the organics between the first and second electrodes is high. In addition, since stress is higher when holes are injected into the first electrode than when electrons are injected into the second electrode, materials having high hole transportability have been developed as organics for use between the first and second electrodes. In the case in which an organic material having high hole transportability is used for an emission layer, however, electrons and holes are out of balance. For this reason, a material having low hole transportability is used as a host of the emission layer. Up until recently, in a two-stack structure, a material having low hole transportability has been equally used for the emission layer of each stack.

In the structure, however, the second stack 140 does not directly abut the anode (the first electrode) but abuts the p-type charge generation layer 132 to receive holes therefrom. Since the main material of the p-type charge generation layer 132 is an organic material, although it is doped with a p-type dopant, the supply of holes to the second stack 140 is limited. In the case in which a material having low hole transportability is used as the host of the emission layer of the second stack 140, therefore, hole transportability is lowered over time. As a result, as shown in FIG. 2A, an emission zone is shifted from the inside of the second emission layer 142 to the interface of the second hole transport layer 141 due to the difference in supply speed between holes and electrons. That is, in the second stack, the second electrode and the second electron transport layer 143 almost abut each other or are adjacent to each other, whereby the amount of electrons that are supplied may be greater than the amount of holes that are supplied. As a result, the emission zone is shifted over time due to the supply of a relatively excessive number of electrons due to such difference in the amount of supply.

In the organic light-emitting device according to the present invention, the emission layers of the first and second stacks are configured in advance so as to be different from each other at the time of forming the first and second stacks in consideration of the difference in efficiency between the emission layers of the first and second stacks when the emission layers are the same.

That is, as shown in FIG. 2B, the mobility or the highest occupied molecular orbital (HOMO) energy level of the host materials of the emission layers of the first and second stacks or the composition ratio of the materials included in the hosts are adjusted such that the emission zone is maintained without any change in the second stack over time.

Meanwhile, in FIG. 1, unexplained reference numeral 160 indicates a capping layer, which protects the second electrode 150 and improves outcoupling.

Hereinafter, different forms of the emission layers of the first and second stacks of the present invention will be described with reference to embodiments corresponding thereto.

First, an embodiment in which a single bipolar host is provided at each emission layer and the hosts are different from each other will be described.

Figure 3A:
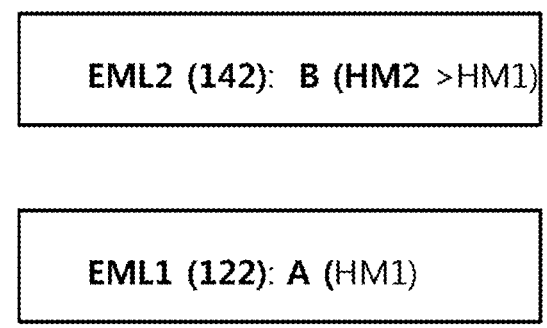
FIG. 3A is a view showing an organic light-emitting device according to a first embodiment of the present invention.
Figure 3B:
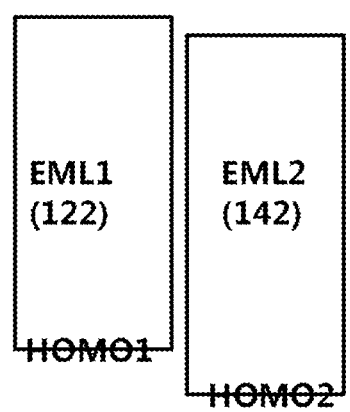
FIG. 3B is a view showing an organic light-emitting device according to a modification of the first embodiment of the present invention.

FIG. 3A is a view showing an organic light-emitting device according to a first embodiment of the present invention, and FIG. 3B is a view showing an organic light-emitting device according to a modification of the first embodiment of the present invention.

As shown in FIG. 3A, in the organic light-emitting device according to the first embodiment of the present invention, the first emission layer 122 and the second emission layer 142 of the stacks have a first bipolar host A and a second bipolar host B, respectively. The hole mobility HM2 of the second host B may be higher than the hole mobility HM1 of the first host A (HM2>HM1).

Alternatively, as shown in FIG. 3B, the HOMO energy level HOMO2 of the second host B of the second emission layer 142 may be lower than the HOMO energy level HOMO1 of the first host A of the first emission layer 122 (HOMO2<HOMO1). A HOMO energy level has a negative value. Expressed as an absolute value, the HOMO energy level of the second host B is high.

The first and second emission layers 122 and 142 include the same dopant for emitting the same color.

Depending on the circumstances, the hole mobility characteristics of FIG. 3A and the HOMO energy level difference of FIG. 3B may be simultaneously applied to the first and second hosts A and B of the first and second emission layers 122 and 142, even though they are individually applied. That is, the host materials A and B may have the hole mobility difference and the HOMO energy level difference therebetween.

Due to the difference in properties between the materials of the hosts A and B provided in the first and second emission layers 122 and 142, the speed of holes supplied from the p-type charge generation layer 132 to the second stack 140 is adjusted so as to be similar to the speed of holes passing from the first electrode 110 to the first stack 120. As shown in FIG. 2B, therefore, the emission zone is maintained in the initial state without being moved to the interface of the second emission layer over time.

Experimental examples of the organic light-emitting device according to the first embodiment of the present invention are compared with a comparative example. In the comparative example, the first and second emission layers 122 and 142 use the same host.

The following experiments are carried out individually for a blue device and a green device. The reason for this is that the hosts required for color light emission are different.

Figure 4:
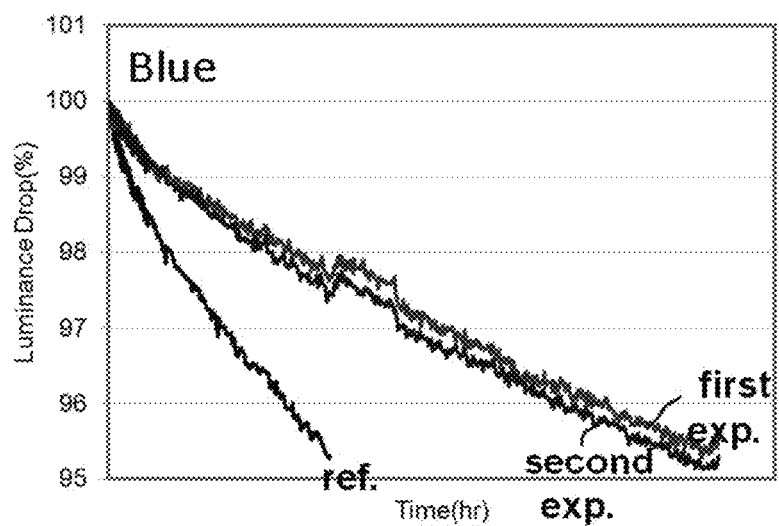
FIG. 4 is a graph showing the lifespan of the organic light-emitting device according to the first embodiment of the present invention when the organic light-emitting device is applied to a blue sub-pixel based on a comparative example and experimental examples.
Figure 5:
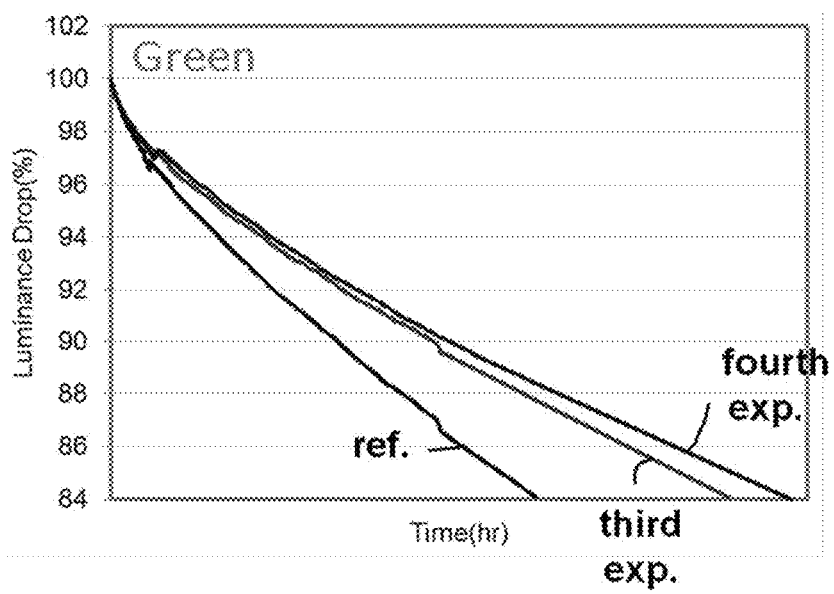
FIG. 5 is a graph showing the lifespan of the organic light-emitting device according to the first embodiment of the present invention when the organic light-emitting device is applied to a green sub-pixel based on a comparative example and experimental examples.

FIG. 4 is a graph showing the lifespan of the organic light-emitting device according to the first embodiment of the present invention when the organic light-emitting device is applied to a blue sub-pixel based on a comparative example and experimental examples, and FIG. 5 is a graph showing the lifespan of the organic light-emitting device according to the first embodiment of the present invention when the organic light-emitting device is applied to a green sub-pixel based on a comparative example and experimental examples.

First, the results of a comparative example and first and second experimental examples with respect to a blue device will be described with reference to Table 1 and FIG. 4. In the comparative example, the first and second emission layers EML1 and EML2 use the same host A1. In the first experimental example, the first emission layer EML1 uses a host A1, and the second emission layer EML2 uses a host B1. In the second experimental example, the first and second emission layers EML1 and EML2 use the same host B1.

In this case, the electron mobility of the host A1 is $1.4 \times 10^{-4}$ cm$^2$/V·s, and the hole mobility of the host A1 is $5.1 \times 10^{-10}$ cm$^2$/V·s. The electron mobility of the host B1 is $2.5 \times 10^{-4}$ cm$^2$/V·s, and the hole mobility of the host B1 is $1.1 \times 10^{-9}$ cm$^2$/V·s. The hole mobility and the electron mobility of the host B1 are higher than those of the host A1. In particular, the difference in hole mobility between the host B1 and the host A1 is a little greater than the difference in electron mobility between the host B1 and the host A1. The following experimental results are interpreted as results based on the difference in hole mobility between materials.

TABLE 1

| | Classification | | Electro-optic characteristics | | | |
|---|---|---|---|---|---|---|
| Blue device | EML1 | EML2 | Drive voltage (V) | Efficiency (%) | CIEx | CIEy |
| Comparative example | A1 | A1 | 8.0 | 100% | 0.144 | 0.051 |
| First experimental example | A1 | B1 | 7.7 | 116% | 0.144 | 0.051 |
| Second experimental example | B1 | B1 | 7.7 | 106% | 0.144 | 0.051 |

Referring to Table 1, it can be seen that the first experimental example of the blue device, in which the host B1, which has high hole mobility, is used in the second emission layer and the host A1, which has low hole mobility, is used in the first emission layer, exhibits the highest efficiency.

In addition, the second experimental example also exhibits improved efficiency and increased lifespan, which is interpreted as the effect obtained as the result of improving the efficiency of the second stack.

Referring to FIG. 4, it can be seen that the first and second experimental examples of the blue device have lifespan at least two times longer than the comparative example.

The results of a comparative example and third and fourth experimental examples with respect to a green device will be described with reference to Table 2 and FIG. 5. In the comparative example, the first and second emission layers EML1 and EML2 use the same host A2. In the third experimental example, the first emission layer EML1 uses a host A2, and the second emission layer EML 2 uses a host B2. In the fourth experimental example, the first and second emission layers EML1 and EML2 use the same host B2.

In this case, the electron mobility of the host A2 is 2.2×10-4 cm2/V·s, and the hole mobility of the host A2 is 6.1×10-6 cm2/V·s. The electron mobility of the host B2 is 3.5×10-4 cm2/V·s, and the hole mobility of the host B2 is 2.0×10-5 cm2/V·s. The hole mobility and the electron mobility of the host B2 are higher than those of the host A2. In particular, the difference in hole mobility between the host B2 and the host A2 is at least three times greater than the difference in electron mobility between the host B2 and the host A2. The following experimental results are interpreted as results based on the difference in hole mobility between materials.

TABLE 2

| | Classification | | Electro-optic characteristics | | | |
|---|---|---|---|---|---|---|
| Green device | EML1 | EML2 | Drive voltage (V) | Efficiency (%) | CIEx | CIEy |
| Comparative example | A2 | A2 | 8.3 | 100% | 0.293 | 0.681 |
| Third experimental example | A2 | B2 | 8.1 | 105% | 0.293 | 0.681 |

TABLE 2-continued

| | Classification | | Electro-optic characteristics | | | |
|---|---|---|---|---|---|---|
| Green device | EML1 | EML2 | Drive voltage (V) | Efficiency (%) | CIEx | CIEy |
| Fourth experimental example | B2 | B2 | 7.8 | 100% | 0.293 | 0.681 |

Referring to Table 2, it can be seen that the third experimental example of the green device, in which the host B2, which has high hole mobility, is used in the second emission layer and the host A2, which has low hole mobility, is used in the first emission layer, exhibits the highest efficiency.

Referring to FIG. 5, the fourth experimental example also exhibits increased lifespan, which is interpreted to result from improving the efficiency of the second stack.

Referring to FIG. 5, it can be seen that the third and fourth experimental examples of the green device have lifespan at least 1.5 times longer than the comparative example.

In the above experiments, it can be seen that, when a material having higher hole mobility than the material used as the host of the first emission layer is used as the host of the second emission layer, efficiency is improved and lifespan is increased.

Meanwhile, in the case in which, in the first embodiment, a single bipolar host is provided in each of the first and second emission layers, the basic function of the host is to supply energy to a dopant such that the dopant contributes to emit light. Consequently, the hosts of the first and second emission layers may be amine, ether, or anthracene derivatives having the same frame and only differing as to substituent groups in order to realize the HOMO energy level difference or the hole mobility difference.

The first embodiment described above is characterized in that, when a single bipolar host is used in each emission layer, the materials of the hosts are different from each other such that the hole transport rate to the second emission layer is improved.

However, the present invention is not limited thereto. In second and third embodiments of the present invention, when a hole transport host and an electron transport host are used in each emission layer, the amount of each host may be adjusted or the mobility characteristics may be set differently from each other. In the following description, a plurality of hosts is used in each emission layer.

Figures 6, 7A:
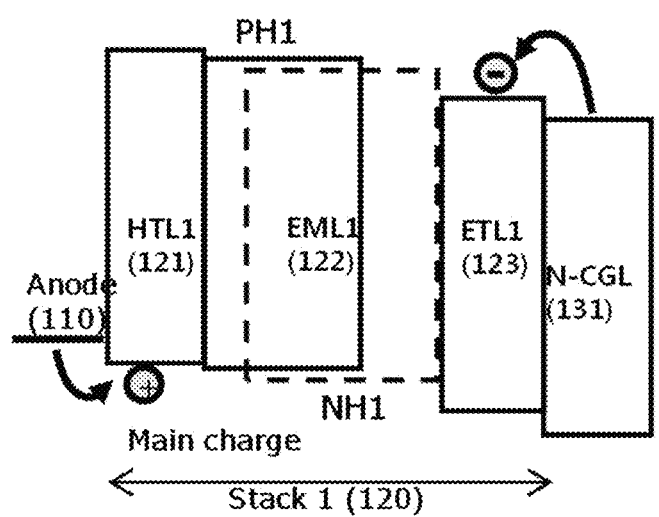
FIG. 6 is a view showing an organic light-emitting device according to a second embodiment of the present invention.
FIGS. 7A and 7B are views showing the movement of holes and electrons in each stack of FIG. 6.
Figures 7B, 8:
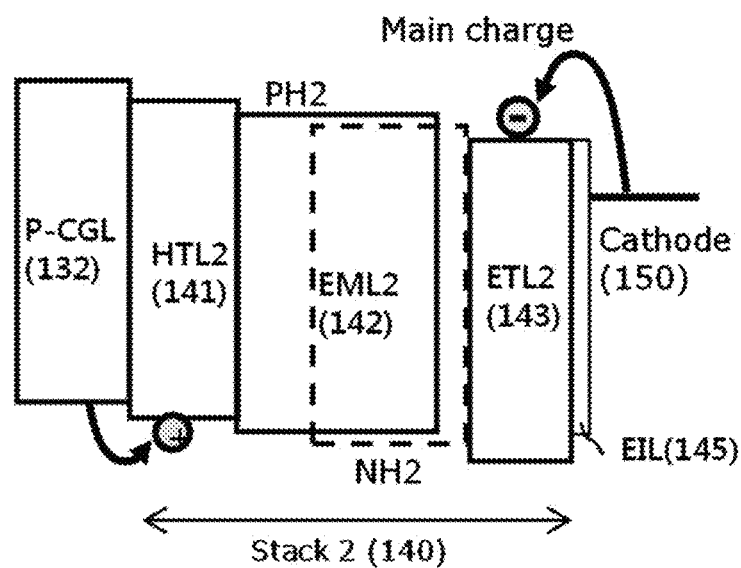
FIG. 8 is a view showing an organic light-emitting device according to a third embodiment of the present invention.

FIG. 6 is a view showing an organic light-emitting device according to a second embodiment of the present invention, and FIGS. 7A and 7B are views showing the movement of holes and electrons in each stack of FIG. 6.

As shown in FIG. 6, in the organic light-emitting device according to the second embodiment of the present invention, an n-type host, a p-type host, and a dopant is provided for each of the first emission layer 122 of the first stack and the second emission layer 142 of the second stack shown in FIG. 1; however, the amounts thereof are different from each other.

The first emission layer (EML1) 122 has a first hole transport host PH1 and a first electron transport host NH1, and the second emission layer (EML2) 142 has a second hole transport host PH2 and a second electron transport host NH2.

The amount of the second hole transport host PH2 in the second emission layer (EML2) 142 may be greater than the amount of the first hole transport host PH1 in the first emission layer (EML1) 122, and the amount of the first electron transport host NH1 in the first emission layer (EML1) 122 may be greater than the amount of the second electron transport host NH2 in the second emission layer (EML2) 142. As a result, the first emission layer (EML1) 122 may exhibit a higher electron transport rate than the second emission layer (EML2) 142, and the second emission layer (EML2) 142 may exhibit a higher hole transport rate than the first emission layer (EML1) 122.

The hole transport hosts PH1 and PH2 included in the first and second emission layers may be made of the same material, and the electron transport hosts NH1 and NH2 included in the first and second emission layers may be made of the same material, but the amounts thereof are set differently from each other in order to achieve the same effect.

In experiments shown in Table 3, efficiency, drive voltage, color coordinates, and lifespan are evaluated in the state in which the hole transport hosts and the electron transport hosts included in the first and second emission layers of the second embodiment are made of the same material, but in which the amounts thereof are different from each other. In a comparative example, the ratio of the hole transport host PH to the electron transport host NH included in each of the first and second emission layers is 1:1.

TABLE 3

| Classification | Host ratio (p-type:n-type) EML1 | | Drive voltage (V) | Efficiency (Cd/A) | CIEx | CIEy | Lifespan (%) |
|---|---|---|---|---|---|---|---|
| | EML1 | EML1 | | | | | |
| Comparative example | 1:1 | 1:1 | 6.0 | 245.1 | 0.215 | 0.721 | 100% |
| Fifth experimental example | 1:2 | 1:2 | 5.7 | 199.4 | 0.215 | 0.722 | 98% |
| Sixth experimental example | 2:1 | 2:1 | 6.2 | 216.8 | 0.219 | 0.718 | 102% |
| Seventh experimental example | 2:1 | 1:2 | 6.4 | 210.1 | 0.214 | 0.722 | 88% |
| Eighth experimental example | 1:2 | 2:1 | 5.8 | 230.7 | 0.220 | 0.717 | 110% |
| Ninth experimental example | 1:4 | 4:1 | 6.0 | 205.4 | 0.234 | 0.712 | 94% |

When comparing the hole transport host (p-type) with the electron transport host (n-type) in terms of electron mobility, the electron mobility of the hole transport host (p-type) is $5.7 \times 10^{-7}$ cm2/V·s, and the electron mobility of the electron transport host (n-type) is $4.4 \times 10^{-5}$ cm2/V·s.

Among the fifth to ninth experimental examples, the eighth experimental example has the longest lifespan. In this case, the ratio of the hole transport host (p-type) to the electron transport host (n-type) included in the first emission layer EML1 is 1:2, and the ratio of the hole transport host (p-type) to the electron transport host (n-type) included in the second emission layer EML2 is 2:1. That is, the amount of the electron transport host in the first emission layer of the first stack, which is a lower stack, is greater than the amount of the hole transport host in the first emission layer of the first stack, and the amount of the hole transport host in the second emission layer of the second stack, which is an upper stack, is greater than the amount of the electron transport host in the second emission layer of the second stack. The drive voltage of the eighth experimental example is lower than that of the comparative example, and the efficiency of the eighth experimental example is almost equal to that of the comparative example. (The efficiency of the eighth experimental example is lower than that of the comparative example, in which case color coordinates are different from each other; however, it is expected for the efficiency of the eighth experimental example to be higher than that of the comparative example on the assumption that the color coordinates are equal.) It can be seen that, when the ratio in the amount of hole transport hosts (p-type) to electron transport hosts (n-type) in the emission layers of the first and second stacks is changed, particularly when the hole transportability of the emission layer of the first stack is increased and the electron transportability of the emission layer of the second stack is increased, efficiency is increased.

FIG. 8 is a view showing an organic light-emitting device according to a third embodiment of the present invention.

As shown in FIG. 8, in the organic light-emitting device according to the third embodiment of the present invention, an n-type host, a p-type host, and a dopant are provided for each of the first emission layer 122 of the first stack and the second emission layer 142 of the second stack shown in FIG. 1; however, the amounts thereof are different from each other.

The first emission layer (EML1) 122 has a first hole transport host PH1 and a first electron transport host NH1, and the second emission layer (EML2) 142 has a second hole transport host PH2 and a second electron transport host NH2.

In this case, the same transport hosts provided in the emission layers are different in material from each other. Consequently, the second hole mobility HM2 of the second hole transport host PH2 is greater than the first hole mobility HM1 of the first hole transport host PH1, and the first electron mobility EM1 of the first electron transport host NH1 is greater than the second electron mobility EM2 of the second electron transport host NH2.

In the organic light-emitting device according to the third embodiment, different transport hosts are provided in the first and second emission layers. Consequently, the first emission layer exhibits high electron transportability, and the second emission layer exhibits high hole transportability, due to the mobility difference between the materials. Consequently, the same result as in the second embodiment is obtained.

In the structure of the third embodiment, the first emission layer is far from the second electrode (the cathode). Consequently, the electron mobility of different kinds of materials having high electron transportability provided in the first emission layer is increased in order to supplement the supply of electrons. In addition, the second emission layer is far from the first electrode (the anode).

Consequently, the hole mobility of different kinds of materials having high hole transportability provided in the second emission layer is increased in order to supplement the supply of holes.

The hole mobility HM of the first hole transport host PH1 may be at least 10 times higher than that of the first electron transport host NH1, and the electron mobility EM of the first electron transport host NH1 may be at least 10 times higher than that of the first hole transport host PH1.

In addition, the hole mobility of the second hole transport host PH2 may be at least 10 times higher than that of the second electron transport host NH2, and the electron mobility of the second electron transport host NH2 may be at least 10 times higher than that of the second hole transport host PH2.

Furthermore, the hole mobility of the second hole transport host PH2 may be higher than that of the first hole transport host PH1 (HM1 of PH1<HM2 of PH2), and the electron mobility of the first electron transport host NH1 may be higher than that of the second electron transport host NH2 (EM1 of NH1>EM2 of NH2).

Meanwhile, in the case in which the hole transport hosts are provided in the first and second emission layers of the third embodiment, compounds having the same chemical frame as an electron donating unit but only different substituent groups to thus change hole mobility may be used, although completely different materials may be used. For the electron transport hosts, halogen or hetero-aromatic compounds having different substituent groups may be used in order to change electron mobility.

Meanwhile, the above embodiments may be applied to an organic light-emitting display device according to the same principle.

Figure 9:
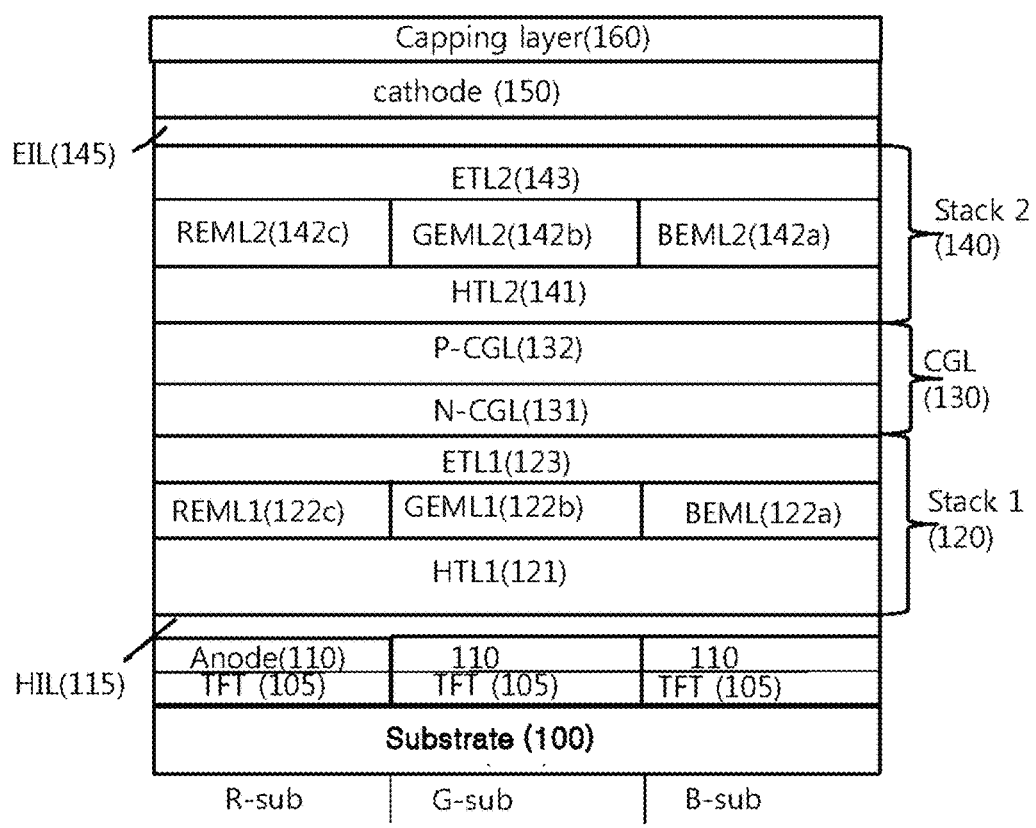
FIG. 9 is a sectional view showing an organic light-emitting display device according to an embodiment of the present invention.

FIG. 9 is a sectional view showing an organic light-emitting display device according to the present invention.

As shown in FIG. 9, the organic light-emitting display device according to the present invention may include a substrate 100 having a plurality of sub-pixels, a thin film transistor (TFT) 105 provided at at least one of the sub-pixels on the substrate, and an organic light-emitting device (e.g. the OLED of FIG. 1) connected to the thin film transistor (TFT).

The thin film transistor (TFT) 105 is an element that is connected to a first electrode 110 of the organic light-emitting diode (OLED) in order to turn on each sub-pixel. Although diagrammatically shown, the thin film transistor includes an active layer, a gate electrode, and source and drain electrodes connected to both ends of the active layer.

A hole injection layer 115 is commonly provided for first to third sub-pixels B-sub, G-sub, and R-sub, and assists in the injection of holes from the first electrode 110.

The structures of a first stack (stack 1) 120, a charge generation layer (CGL) 130, and a second stack (stack 2) 140 are identical to those of FIG. 1, and the functions thereof are identical to what was described with reference to FIGS. 2B to 8, and therefore a description thereof will be omitted.

In the most basic function, first emission layers 122a, 122b, and 122c of the first stack (stack 1) and second emission layers 142a, 142b, and 142c of the second stack (stack 2) emit the same color light, but the emission layers have different hosts. In the case in which the host of each of the emission layers 122a, 122b, 122c, 142a, 142b, and 142c is a single bipolar material, the second emission layers 142a, 142b, and 142c are made of a material having higher hole mobility and lower HOMO than the first emission layers 122a, 122b, and 122c. In the case in which the host of each emission layer is a mixture of an electron transport host and a hole transport host, the first emission layers 122a, 122b, and 122c exhibit high electron transportability, and the second emission layers 142a, 142b, and 142c exhibit high hole transportability. In the latter case, the transportability of the emission layers of the first and second stacks may be obtained by applying materials having different amounts of the same dopant or different degrees of mobility to the first and second emission layers. As a result, the stacks may be configured to have different degrees of transportability without being limited to the above-specified methods.

Meanwhile, a capping layer 160 for protecting a second electrode 150 and performing outcoupling is provided on the second electrode 150. An encapsulation layer for preventing moisture or air from entering from the outside is provided on the capping layer.

In addition, in the example shown, first to third emission layers BEML, GEML, and REML of the sub-pixels B-sub, G-sub, and R-sub are shown as having the same thickness for the sake of convenience. In the case in which the optical distance is structurally adjusted using the emission layers, however, the emission layers of the sub-pixels, which emit light having different colors, may have different heights. The height of the red emission layer REML, which has a long wavelength, may be the largest, the height of the green emission layer GEML may be second largest, and the height of the blue emission layer BEML, which has a short wavelength, may be the smallest. In a dual-stack structure in which one emission layer is provided for each stack, the heights of the second electrodes 150 of the sub-pixels may be different from each other.

Consequently, the organic light-emitting device according to the present invention and the organic light-emitting display device using the same may be configured such that, in a tandem structure, in which the same emission layer is provided for each stack to achieve high efficiency, the material of the emission layer of the upper stack, which is not structurally adjacent to the electrode and in which the supply of holes is thus insufficient, and the material of the emission layer that is adjacent to the electrode, in which the supply of holes is thus sufficient, are configured to be different from each other, or the amounts of hosts are adjusted to be different from each other, thereby maintaining the balance between holes and electrons in the emission layer of each stack over time and thus increasing lifespan based on charge balance.

Furthermore, the emission zone may be maintained in each emission layer, thereby preventing electrons or holes from being stacked at the interface between the emission layer and another layer adjacent thereto.

In addition, the material of the emission layer in the second stack, which is far from the electrode, may be changed to assist in receiving holes, thereby increasing the recombination rate of electrons and holes and thus improving efficiency.

In the above example, two stacks that emit light having the same color are provided to constitute a dual stack. However, the present invention is not limited thereto. For example, three or more stacks may be provided. In this case, the emission layer near the anode may exhibit higher electron transportability, and the emission layer near the cathode may exhibit higher hole transportability.

As is apparent from the above description, an organic light-emitting device according to the present invention and an organic light-emitting display device using the same have the following effects.

The organic light-emitting device according to the present invention may be configured such that, in a tandem structure, in which the same emission layer is provided for each stack to achieve high efficiency, the material of the emission layer of the upper stack, which is not structurally adjacent to the electrode and in which the supply of holes is thus insufficient, and the material of the emission layer that is adjacent to the electrode, in which the supply of holes is thus sufficient, are configured to be different from each other, thereby maintaining the balance between holes and electrons in the emission layer of each stack over time and thus increasing lifespan based on charge balance.

Furthermore, the emission zone may be maintained in each emission layer, thereby preventing electrons or holes from being stacked at the interface between the emission layer and another layer adjacent thereto.

In addition, the material of the emission layer in the second stack, which is far from the electrode, may be changed to assist in receiving holes, thereby increasing the recombination rate of electrons and holes and thus improving efficiency.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical sprit of the present invention, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

What is claimed is:

1. An organic light-emitting device comprising:
a first electrode and a second electrode provided opposite each other;
a charge generation layer provided between the first electrode and the second electrode;
a first stack provided between the first electrode and the charge generation layer, the first stack comprising a first hole transport layer, a first emission layer, and a first electron transport layer; and
a second stack provided between the charge generation layer and the second electrode, the second stack comprising a second hole transport layer, a second emission layer, which emits a same color as the first emission layer, and a second electron transport layer,
wherein a hole transport rate of the second emission layer is higher than a hole transport rate of the first emission layer so that an emission zone of the second emission layer is maintained without movement towards the charge generation layer over time.

2. The organic light-emitting device according to claim 1, wherein:
the first emission layer and the second emission layer have a first bipolar host and a second bipolar host, respectively, and
hole mobility of the second host is higher than hole mobility of the first host, or a highest occupied molecular orbital (HOMO) energy level of the second host is lower than a HOMO energy level of the first host.

3. The organic light-emitting device according to claim 2, wherein an electron mobility of the second host is higher than an electron mobility of the first host.

4. The organic light-emitting device according to claim 1, wherein:
the first emission layer has a first hole transport host and a first electron transport host, and
the second emission layer has a second hole transport host and a second electron transport host.

5. The organic light-emitting device according to claim 4, wherein:
an electron transport rate of the first emission layer is higher than an electron transport rate of the second emission layer, and
a hole transport rate of the second emission layer is higher than a hole transport rate of the first emission layer.

6. The organic light-emitting device according to claim 5, wherein:
an amount of the second hole transport host in the second emission layer is greater than an amount of the first hole transport host in the first emission layer, and
an amount of the first electron transport host in the first emission layer is greater than an amount of the second electron transport host in the second emission layer.

7. The organic light-emitting device according to claim 4, wherein:
a hole mobility of the first hole transport host is at least 10 times higher than a hole mobility of the first electron transport host, and
an electron mobility of the first electron transport host is at least 10 times higher than an electron mobility of the first hole transport host.

8. The organic light-emitting device according to claim 7, wherein:
a hole mobility of the second hole transport host is at least 10 times higher than hole mobility of the second electron transport host, and
an electron mobility of the second electron transport host is at least 10 times higher than electron mobility of the second hole transport host.

9. The organic light-emitting device according to claim 4, wherein:
a hole mobility of the second hole transport host is higher than a hole mobility of the first hole transport host, and
an electron mobility of the first electron transport host is higher than an electron mobility of the second electron transport host.

10. An organic light-emitting display device comprising:
a substrate having a plurality of sub-pixels;
a thin film transistor provided at at least one of the sub-pixels on the substrate; and
an organic light-emitting device connected to the thin film transistor,
wherein the organic light-emitting device comprises:
a first electrode and a second electrode opposite each other;
a charge generation layer provided between the first electrode and the second electrode;
a first stack provided between the first electrode and the charge generation layer, the first stack comprising a first hole transport layer, a first emission layer, and a first electron transport layer; and
a second stack provided between the charge generation layer and the second electrode, the second stack comprising a second hole transport layer, a second emission layer, which emits a same color as the first emission layer, and a second electron transport layer, and
wherein a hole transport rate of the second emission layer is higher than a hole transport rate of the first emission layer so that an emission zone of the second emission layer is maintained without movement towards the charge generation layer over time.

11. The organic light-emitting device according to claim 10, wherein a highest occupied molecular orbital (HOMO) energy level of a second host in the second emission layer is lower than a HOMO energy level of a first host of the first emission layer.

12. The organic light-emitting device according to claim 11, wherein an electron mobility of the second host is higher than an electron mobility of the first host.

13. An organic light-emitting device comprising:
- a first electrode and a second electrode provided opposite each other;
- a charge generation layer provided between the first electrode and the second electrode;
- a first stack provided between the first electrode and the charge generation layer, the first stack comprising a first hole transport layer, a first emission layer, and a first electron transport layer; and
- a second stack provided between the charge generation layer and the second electrode, the second stack comprising a second hole transport layer, a second emission layer, which emits a same color as the first emission layer, and a second electron transport layer,
- wherein a hole transport rate of the second emission layer is higher than a hole transport rate of the first emission layer, and
- wherein an electron transport rate of the first emission layer is higher than an electron transport rate of the second emission layer.

* * * * *